United States Patent [19]
Lee et al.

[11] Patent Number: 5,987,732
[45] Date of Patent: Nov. 23, 1999

[54] METHOD OF MAKING COMPACT INTEGRATED MICROWAVE ASSEMBLY SYSTEM

[75] Inventors: Alfred E. Lee, Torrance; Roger A. Davidheiser, Manhattan Beach; James C. Lau, Torrance, all of Calif.

[73] Assignee: TRW Inc., Redondo Beach, Calif.

[21] Appl. No.: 09/137,288

[22] Filed: Aug. 20, 1998

[51] Int. Cl.⁶ .................................................. H01P 11/00
[52] U.S. Cl. .................................. 29/600; 29/830; 29/852
[58] Field of Search ..................... 29/852, 830, 25.42, 29/600

[56] References Cited

U.S. PATENT DOCUMENTS

| | | |
|---|---|---|
| 5,323,520 | 6/1994 | Peters et al. ............................ 29/852 X |
| 5,345,205 | 9/1994 | Kornrumpf . |
| 5,355,102 | 10/1994 | Kornrumpf et al. . |
| 5,359,496 | 10/1994 | Kornrumpf et al. . |
| 5,452,182 | 9/1995 | Eichelberger et al. . |
| 5,463,404 | 10/1995 | Wall ....................................... 29/600 X |
| 5,566,441 | 10/1996 | Marsh et al. ............................... 29/600 |
| 5,588,198 | 12/1996 | Kawahata et al. ......................... 29/600 |
| 5,701,645 | 12/1997 | Allen et al. ............................ 29/600 X |

*Primary Examiner*—Carl J. Arbes
*Attorney, Agent, or Firm*—Michael S. Yatsko; Connie M. Thousand

[57] ABSTRACT

The invention relates to a method for producing low cost integrated microwave assemblies, where a photoresist layer is deposited onto a substrate, a portion of the photoresist is selectively removed, a first conductive layer is applied, and, a second portion of the photoresist is removed leaving isolation walls and cavities. Electrical components are placed in the cavities and a first dielectric layer fills the cavities. Vias are created in the first dielectric material exposing the electrical contacts, a second conductive layer is applied into the vias and over the first dielectric material. The second conductive layer is patterned by removing a portion of the second conductive layer creating a signal line pattern in the second conductive layer.

11 Claims, 7 Drawing Sheets

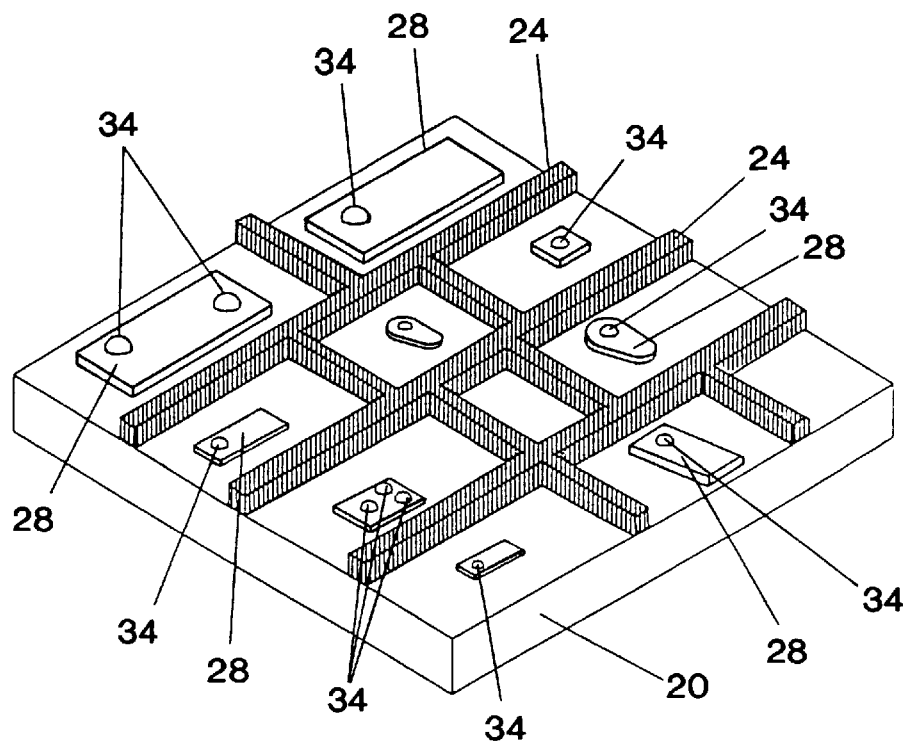
FIG. 5
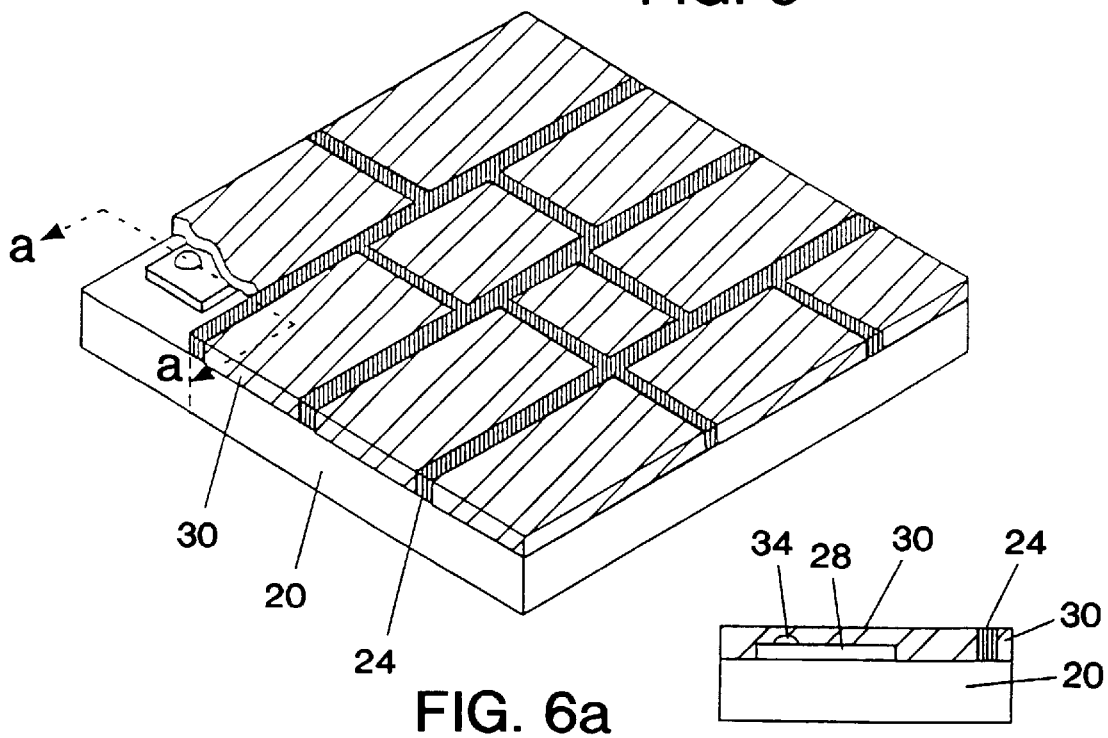
FIG. 6a
section a-a
FIG. 6b

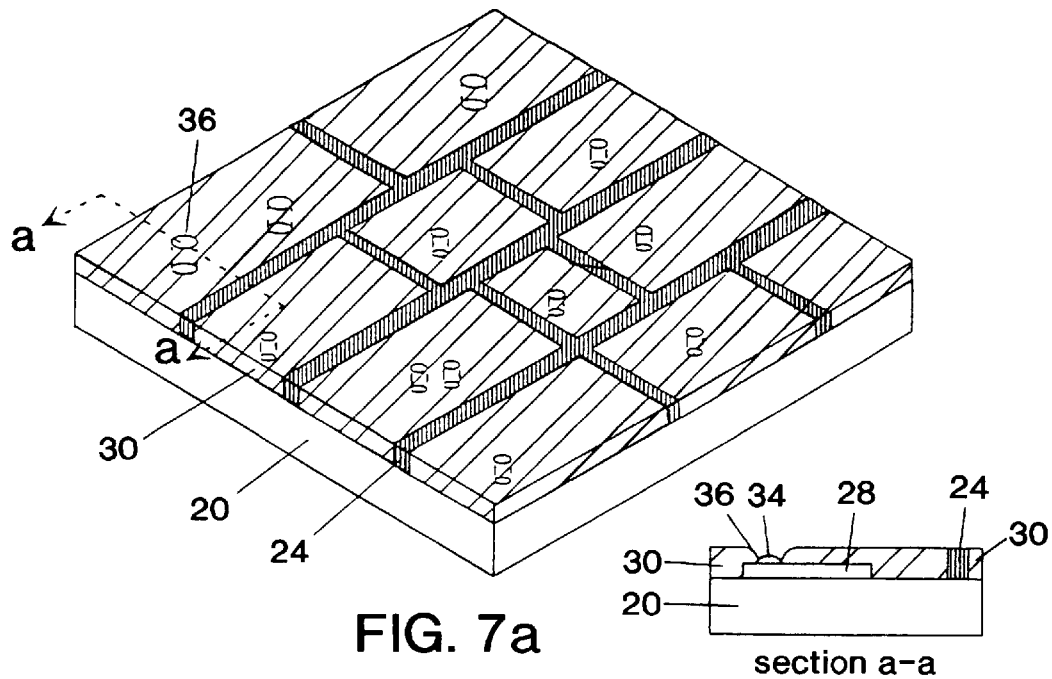
FIG. 7a
section a-a
FIG. 7b
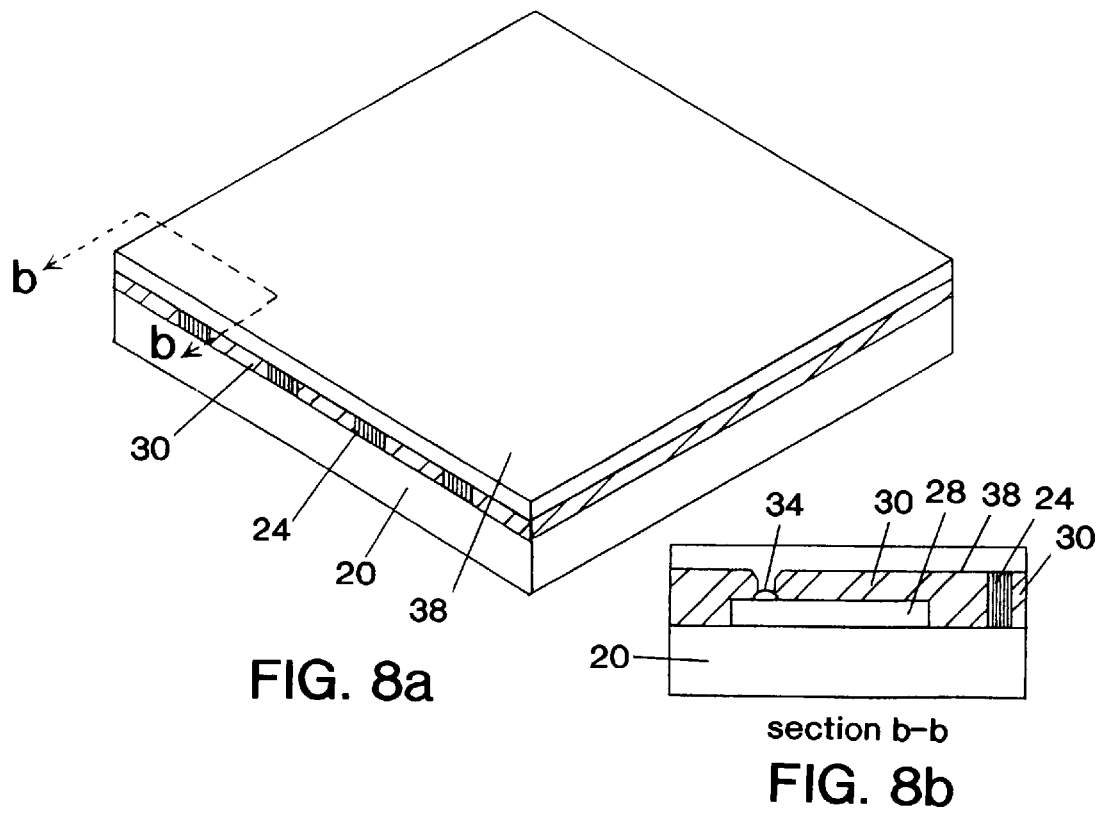
FIG. 8a
section b-b
FIG. 8b

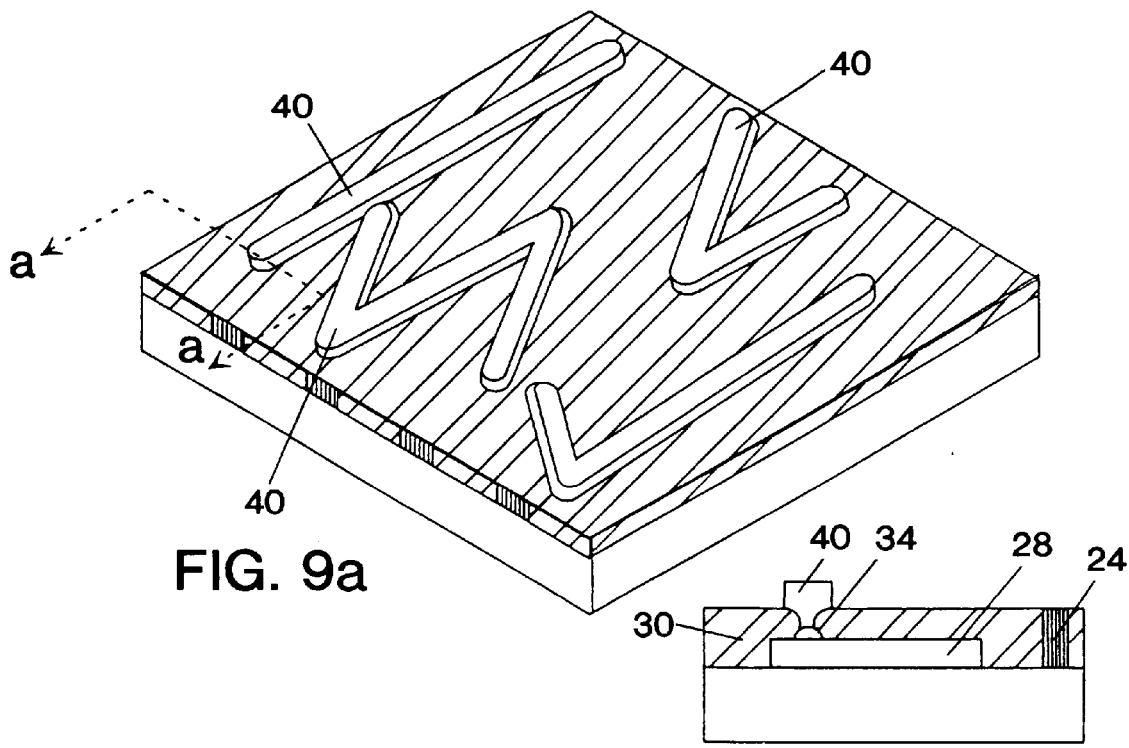
FIG. 9a
FIG. 9b
section a-a
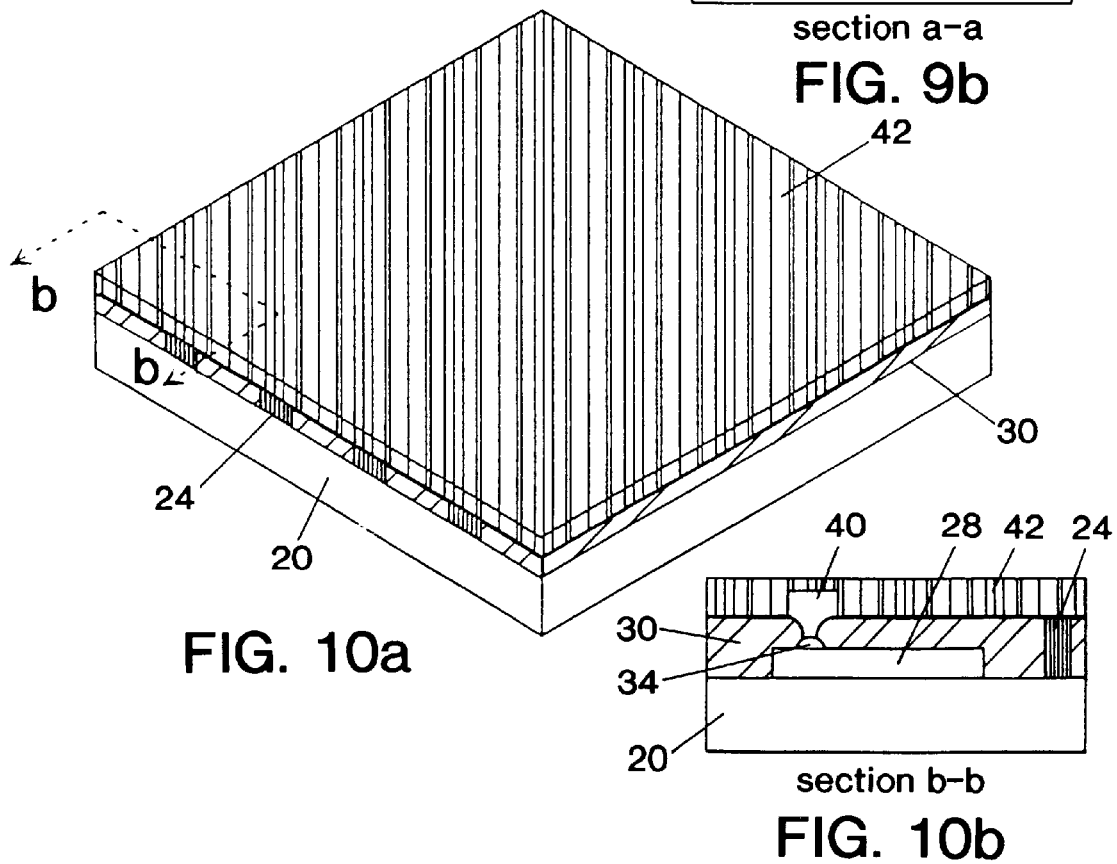
FIG. 10a
FIG. 10b
section b-b section a-a section b-b section a-a

METHOD OF MAKING COMPACT INTEGRATED MICROWAVE ASSEMBLY SYSTEM

BACKGROUND OF THE INVENTION

1. Field of the Invention

The present invention relates to the field of microwave circuits, and more particularly, to a method for producing an integrated microwave assembly.

2. Description of the Prior Art

An integrated microwave assembly (IMA) is an electronic unit functioning at microwave frequencies of above approximately 2 GHz and typically consists of interconnected electrical components inside the IMA and input/output ports outside the IMA to allow connection of the IMA to external assemblies or components.

Electrical components inside the IMA typically consist of transistors, passive circuits, capacitors, chips and the like. These components when placed on the same IMA can interact with one another. This interaction is very undesirable for components which are operated at frequencies above approximately 10 Ghz. To prevent this undesirable interaction between components on the IMA, metallic isolation walls are typically provided on the IMA between electrical components.

One method used to fabricate an IMA with good metallic isolation walls is to machine individual cavities in a non-metallic block of material such as duroid in which to place the electronic chips. Isolation walls are added to the block by creating a plurality of vias around each chip and around each interconnection between chips. These vias are filled with a metallic substance, typically plated copper and/or silver filled epoxy, to create a metallic isolation wall. To obtain good isolation typically requires three isolation walls around each of the electrical components requiring a large amount of real estate on a IMA which limits the number of chips which can populate each IMA.

Another method used to fabricate an IMA with good isolation walls is to machine individual cavities in a metallic substrate, such as aluminum, to various depths. The individual components and chips are placed in the respective cavities such that the portion of the metallic substrate that surrounds each cavity provides electrical isolation between chips.

Although machining cavities on a metallic substrate provides good isolation walls, it is expensive and time consuming since each cavity has to be individually machined inhibiting fabrication of a large number of IMA's by a batch process technique. In addition, the machining cavities results in tolerance limitations which prevent such cavities from being produced with the close tolerances necessary to produce IMA's having repeatable microwave characteristics. Consequently, there is substrate-to-substrate variation of the microwave characteristics of such nominally identical substrates.

In addition to machining tolerances, the electrical chips themselves have fabrication tolerances which results in variations in the location of the chips and the height of the contact pads. If uncertain exists in the location of the electrical components and chips, the length of the interconnection between the chips is uncertain resulting in the inductance added by the interconnection being unknown and variable from substrate to substrate. Manual tuning is typically required to compensate for the unknown inductance created by fabrication and placement tolerances.

Manual tuning typically requires adding an additional tuning circuit to the IMA which takes up valuable space and requires time and expertise to tune the circuit for optimized performance. If an IMA can be fabricated to sufficiently accurate dimensions, known inductance will not be added to the IMA such that manual tuning would not be required.

One method used to more closely control the amount of inductance added to the IMA is to use a laminating process to interconnect the electrical components instead of using wire or ribbon bonding. For this method, a polyimide dielectric film is laminated across the top of the components and the substrate. Vias are laser drilled in the film to expose the contact pads on the electronic components to which it is desired to make contact. A metallization layer which is deposited over the polyimide film layer extends into the via holes and makes electrical contact to the contact pads disposed thereunder. This metallization layer is patterned to form various connections between components on the integrated microwave assembly. However, applying a polyimide dielectric film can cause damage to an IMA circuit since the lamination process involves the application of substantial pressure to the polyimide film which can damage, destroy or modify the performance of the chips and components underneath the polyimide dielectric film.

What is needed therefore, is a method to produce an IMA which provides good isolation between internal components, particularly at frequencies above approximately 10 Ghz, compact isolation walls, and accurate dimension such that after fabrication manual adjustment is not required. The method should not require a laminating process guarding against damage to the IMA. In addition, the method should provide for batch processing to lower the cost of each Integrated Microwave Assembly.

SUMMARY OF THE INVENTION

The preceding and other shortcomings of the prior art are addressed and overcome by the present invention which provides a method for producing an Integrated Microwave Assembly (IMA) which accurately interconnects and electrically isolates electrical component on the IMA free of a laminating process. The method includes applying a layer of photoresist to a substrate. Selectively removing a first preselected portion of the photoresist exposing a first portion of the substrate. Applying a first conductive material over the exposed portion of the substrate, preferably using electroplating techniques, to create isolation walls. Removing a second preselected portion of the photoresist to create cavities. Placing electrical components having contact pads in the cavities with the contact pads positioned distal from the substrate. Covering the electrical components with a first dielectric material. Creating vias in the first dielectric material to expose the contact pads. Applying a second conductive material into the vias and over the first dielectric material. Creating a first signal line pattern by removing a preselected pattern of the second conductive layer.

For an alternative embodiment of the invention, additional dielectric layers are placed on the IMA with layers of conductive material applied over each dielectric layer such that additional signal lines can be created. For the preferred embodiment, the final conductive layer is patterned to provide a ground plane and input/output ports to allow connections of the IMA to external assemblies or components.

BRIEF DESCRIPTION OF THE DRAWINGS

FIGS. 1–9 are illustrations of the integrated microwave assembly preparation steps used for producing low cost integrated microwave assemblies in accordance with the present invention; and, FIGS. 10–13 are illustrations of additional preparation steps to prepare the IMA for connection to external components.

DETAILED DESCRIPTION OF THE INVENTION

The present invention provides a method for producing an integrated microwave assembly (IMA) using photolithography techniques which is free of machining a substrate or using a laminating process to apply a dielectric layer. In addition, by using photolithography techniques, intrinsically accurate dimensions are realized such that after fabrication manual tuning is typically not required to achieve acceptable performance out of the IMA. The invention is perferrably used to produce IMA's which will be operated above approximately 10 GHz where isolation between components is of particular concern. For illustration, the invention is described and illustrated in FIGS. 1 through 9 with additional steps illustrated in FIGS. 10–13 which are used to further prepare the IMA for connection to external components.

Figure 1:
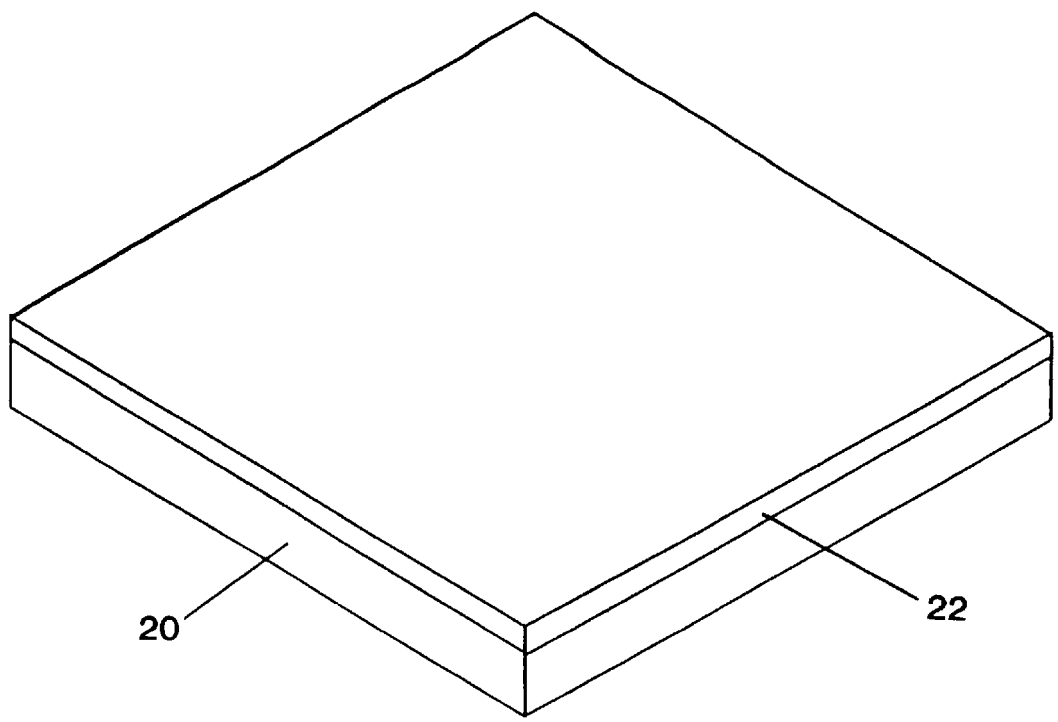

First, as illustrated in FIG. 1, a substrate 20 is provided which is thick enough to allow for handling without breakage or damage, and as thin as possible to minimize the weight and height of the overall integrated microwave assembly. For the preferred embodiment of the invention, the substrate 20 is approximately 20–40 mils thick. The substrate 20 can be comprised of any conductive material such as copper, nickel, aluminum, gold or the like. Alternatively, the substrate 20 can consist of a non-conductive substrate with a conductive layer deposited on both sides of the non-conductive substrate. Preferably, the conductive layer is deposited on both sides such that one layer acts as an electrical ground.

The next steps of the packaging process relates to building electrical isolation walls to prevent components from electrically interacting with each other in an undesirable manner. As illustrated in FIG. 1, to form the isolation walls, a photoresist layer 22 is applied over the conductive substrate 20. The thickness of the photoresist determines the height of the electrical isolation walls. The isolation walls should have a height equal to or greater than the height of the tallest electrical component to be placed on the integrated microwave assembly such that when the electrical component is placed on the conductive substrate 20, it will be completely electrically shielded from other electrical components by an isolation wall. An isolation wall height between 5 and 6 mils is preferred since 5 to 6 mil thick photoresist is commercially available and allows for a great deal of flexibility in choosing components for the integrated microwave assembly.

Figure 2:
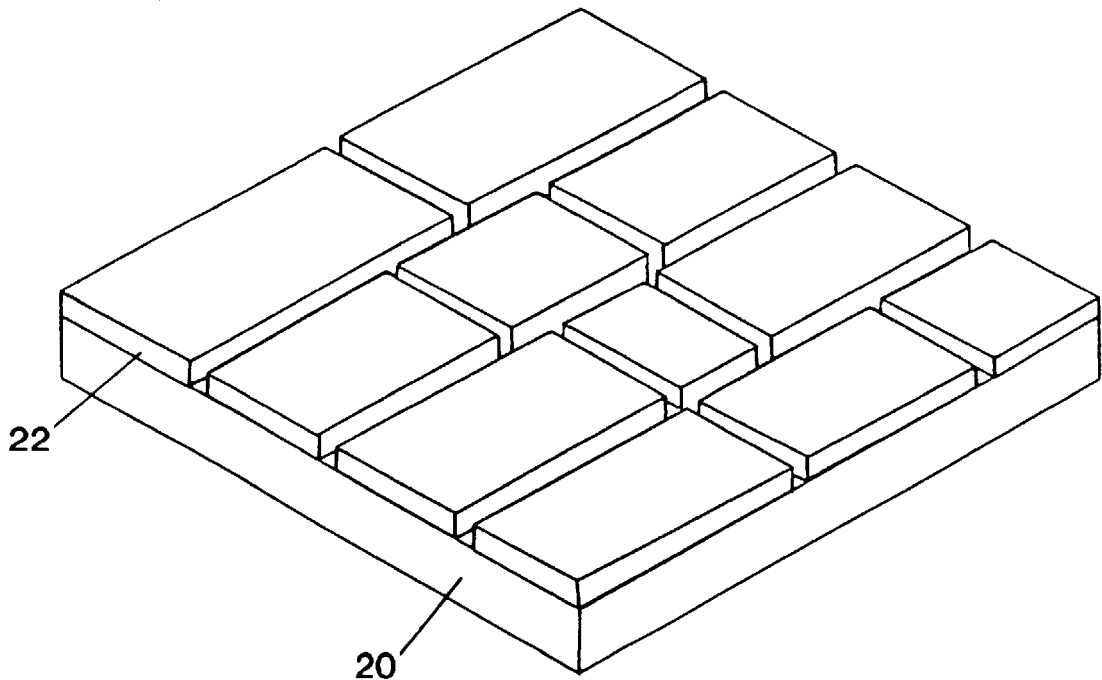

As shown in FIG. 2, the photoresist 22 is selectively removed to expose a portion of the conductive substrate 20. For the preferred embodiment of the invention, to remove a portion of the photoresist 22, a mask, opaque to ultraviolet light is attached to the photoresist 22. The portions of the photoresist 22 not masked off will determine the location and width of the isolation walls which should be of sufficient width to properly attenuate electrical energy, and to maintain the ability to fabricate the walls repeatedly, but not so wide as to require excessive space on the assembly. A width of at least three skin depths of the conductive substrate is typically desired to attenuate at least 99% of the electrical energy.

The portions of the photoresist 22 which are masked off also determine the location and size of the cavities in which the electrical components will be placed. The mask and photoresist 22 are exposed to ultraviolet light. The unmasked portion of the photoresist layer 22 reacts with the ultraviolet light to change the chemistry of the portion of the photoresist 22 exposed to the light but leaves unchanged the chemistry of the portion of the photoresist 22 not exposed to the light. The mask is then removed from the structure and the photoresist is immersed in a chemical bath. The chemical solution reacts with the exposed portion of the photoresist 22 and dissolves the portion of the photoresist layer that was exposed to ultraviolet light. The portion of the photoresist 22 remaining, as shown in FIG. 2, is the portion that was not exposed to the light. For the preferred embodiment of the invention, the chemical solution used is Acetone.

Figure 3:
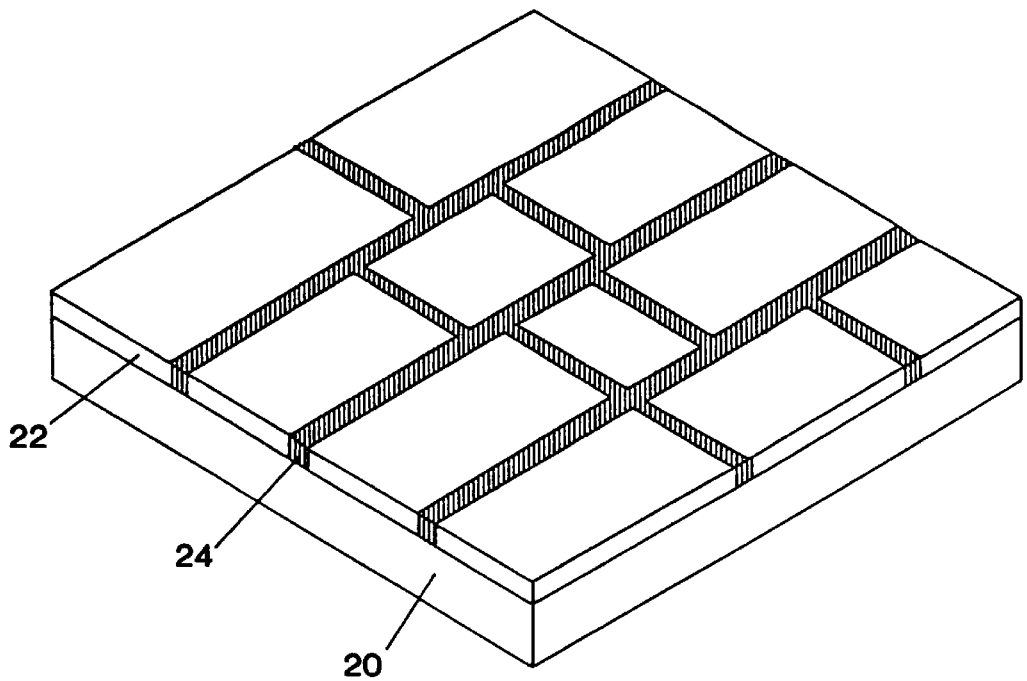

As shown in FIG. 3, the next step is to apply a first conductive layer 24 over the exposed portion of the conductive substrate 20. This first conductive layer 24 will become the isolation walls. For the preferred embodiment of the invention, electroplating is used to apply the first conductive layer 24 to the conductive substrate 20. Electroplating allows a conductive material to be selectively applied where a conductive path exists. For the present invention, conductive paths exist only where the conductive substrate 20 is exposed. The photoresist 22 is a non-conductive material and will therefore prevent accumulation of conductive material in the areas covered by the photoresist 22. For the preferred embodiment of the invention, copper is applied as the first conductive layer 24 using electroplating techniques because of the good conductive properties of copper and the known adhesion properties of copper when electroplated. The electroplating process is continued until the desired thickness of copper is reached. For the preferred embodiment of the invention, the preferred thickness of the copper is the same as the thickness of the photoresist layer 22.

Figure 4:
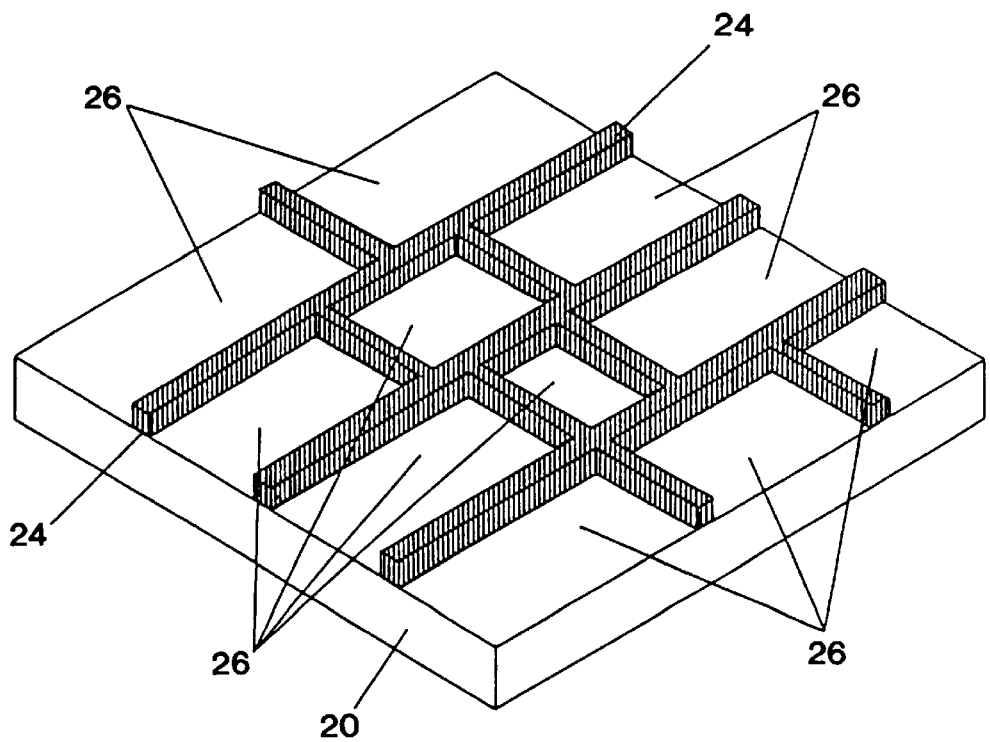

As shown in FIG. 4, the next step is to remove a second predetermined portion of the photoresist 22. For the preferred embodiment of the invention, to remove the second portion of the photoresist 22, the structure is placed in a chemical solution which dissolves the remainder of the photoresist 22. The IMA then consists of isolation walls 24 of a predetermined width and of a height equal to the height of the photoresist layer 22. As shown in FIG. 4, these walls 24 define a plurality of cavities 26.

As shown in FIG. 5, the next step is to place electrical components 28 in the cavities 26. These electrical components 28 can consist of various electrical components such as capacitors, transistors, amplifiers and the like. Each electrical component 28 has a top surface with at least one electrical contact 34 on each top surface. The electrical components 28 are placed on the conductive substrate 20 with the electrical contacts 34 of each component distal from the conductive substrate 20. The electrical components 28 are preferably glued onto the conductive substrate 20 to keep the components 28 from shifting position during the next step of the process. A conductive path between the conductive substrate 20 and the electrical components 28 is desirable for proper operation of the integrated microwave assembly. For the preferred embodiment of the invention, a conductive epoxy glue is used to attach the electrical components 28 to the conductive substrate 20. To provide a good conductive path, the epoxy glue contains a conductive material such as copper, aluminum, gold, silver or the like. For the preferred embodiment of the invention, the epoxy glue contains silver because silver is a very good conductor and silver loaded epoxy glue is readily available on the commercial market.

As shown in FIG. 6, the next step is to cover the top surfaces and the electrical contacts 34 of the electrical components 28 and the remaining exposed portions of the conductive substrate 20 with a first dielectric layer 30. The dielectric is a liquid during the covering step and solidifies upon curing. For the preferred embodiment of the invention, a polyimide material is used for the first dielectric layer 30. For the preferred embodiment of the invention, the cure temperature is 250 degrees Celsius and the cure time is one hour.

As shown in FIG. 7, the next step is to selectively remove a portion of the first dielectric layer 30 creating vias 36 in the first dielectric layer 30 exposing the electrical contacts 34. For the preferred embodiment of the invention, the vias 36 are created using an etching process.

As shown in FIG. 8, the next step is to apply a second conductive layer 38 over the electrical contacts 34 and over the first dielectric layer 30. The second conductive layer 38 extends over the entire first dielectric layer 30 and into the vias 36 such that the second conductive layer 38 fills the vias 36 and contact the electrical contacts 34. Preferably, the second conductive layer 38 is applied by evaporation or sputtering which allows the second conductive layer 38 to fill the vias 36. For the preferred embodiment of the invention, the second conductive layer 38 is applied by sputtering a thin layer of gold (approximately three thousand angstroms) over the first dielectric layer 30 and the electrical contacts 34 and then electroplating copper or gold over the top of the gold to a desired thickness. A sufficient thickness of copper or gold is applied to handle the anticipated currents in the integrated microwave assembly. Combining sputtering and electroplating typically lowers the cost of the integrated microwave assembly over sputtering alone.

As shown in FIG. 9, the next step is to pattern the second conductive layer 38 by removing a preselected portion of the second conductive layer 38 creating a first signal line pattern 40 in the second conductive layer 38. For the preferred embodiment of the invention, the first signal line pattern 40 is formed using an etching process.

If connections between first signals lines are desired, second connection lines can be created by applying a second dielectric material over the first signal lines, creating second vias in the second dielectric material exposing the desired portion of the first signal line, filling the vias and the second dielectric material with a third conductive material and patterning the third conductive material to create a second signal line. Additional signal lines can be created in the above fashion until all desired electrical connections are created.

For the preferred embodiment of the invention, after all the desired connections are created, the IMA is prepared for connection to other IMA's or electrical components. To do so, as shown in FIG. 10, the IMA is covered with a final dielectric layer 42 which is applied to a sufficient thickness such that the capacitive coupling between the integrated microwave assembly and the external components is maintained at an acceptable level. A very thin final dielectric layer 42 is undesirable because it allows excessive capacitive coupling between components 28 on the integrated microwave assembly and components external to the integrated microwave assembly which can change the performance of the integrated microwave assembly in an undesirable manner. It is not necessary to eliminate all capacitive coupling, it is only necessary to maintain the capacitive coupling at an acceptable level. For the preferred embodiment of the invention, a final dielectric layer 42 having a three mil thickness is sufficient to maintain the capacitive coupling at an acceptable level.

Figure 11A:
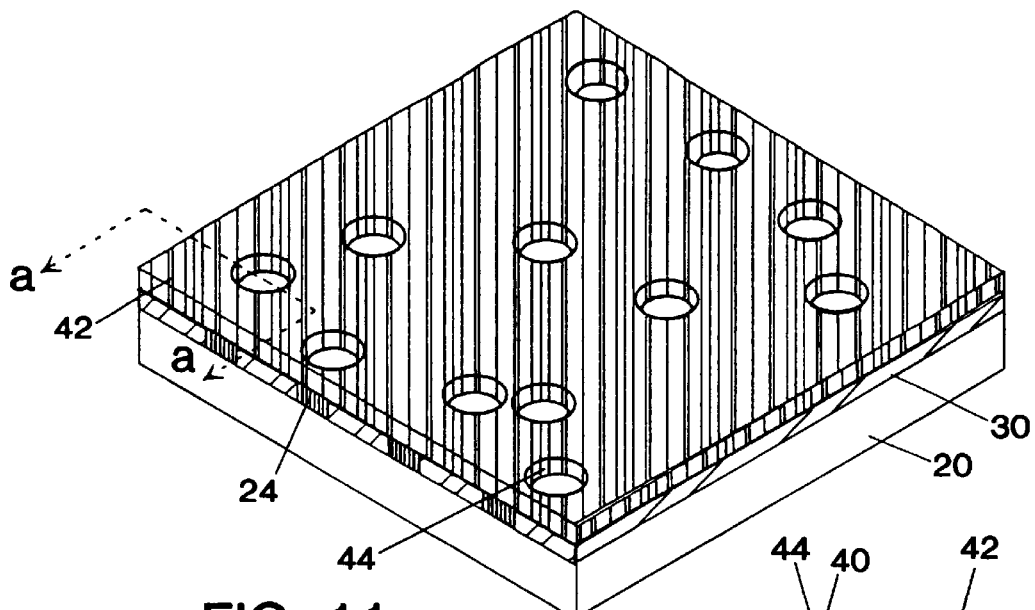
Figure 11B:
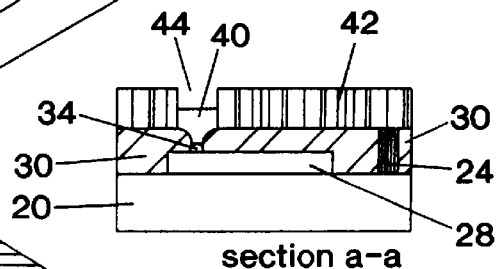

As shown in FIG. 11, final vias are created in the final dielectric material 42. The final vias can be created using laser drilling or etching techniques. For the preferred embodiment of the invention, etching is used to create the final vias 44.

Figure 12A:
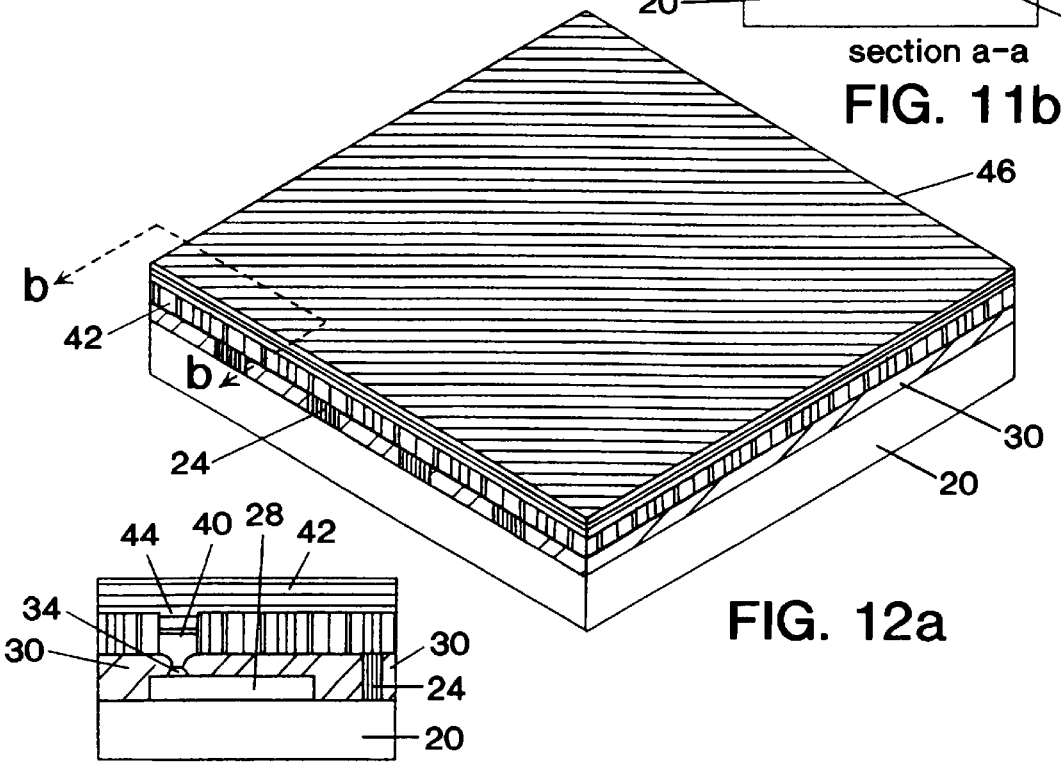
Figure 12B:
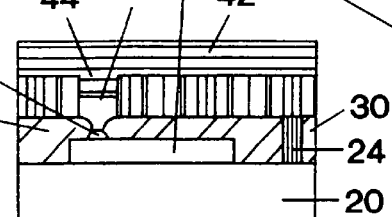

As shown in FIG. 12, a final conductive layer 46 is applied into the vias 44 and over the final dielectric layer 42. The final conductive layer 46 is applied by evaporation or sputtering which allows the final conductive layer 46 to extend into the vias 44. For the preferred embodiment of the invention, the final conductive layer 46 is applied by sputtering a thin layer of gold (approximately three thousand angstroms) and then electroplating copper or gold over the top of the gold to the desired thickness. A sufficient thickness of copper or gold is applied to provide a ground plane for the IMA.

Figure 13A:
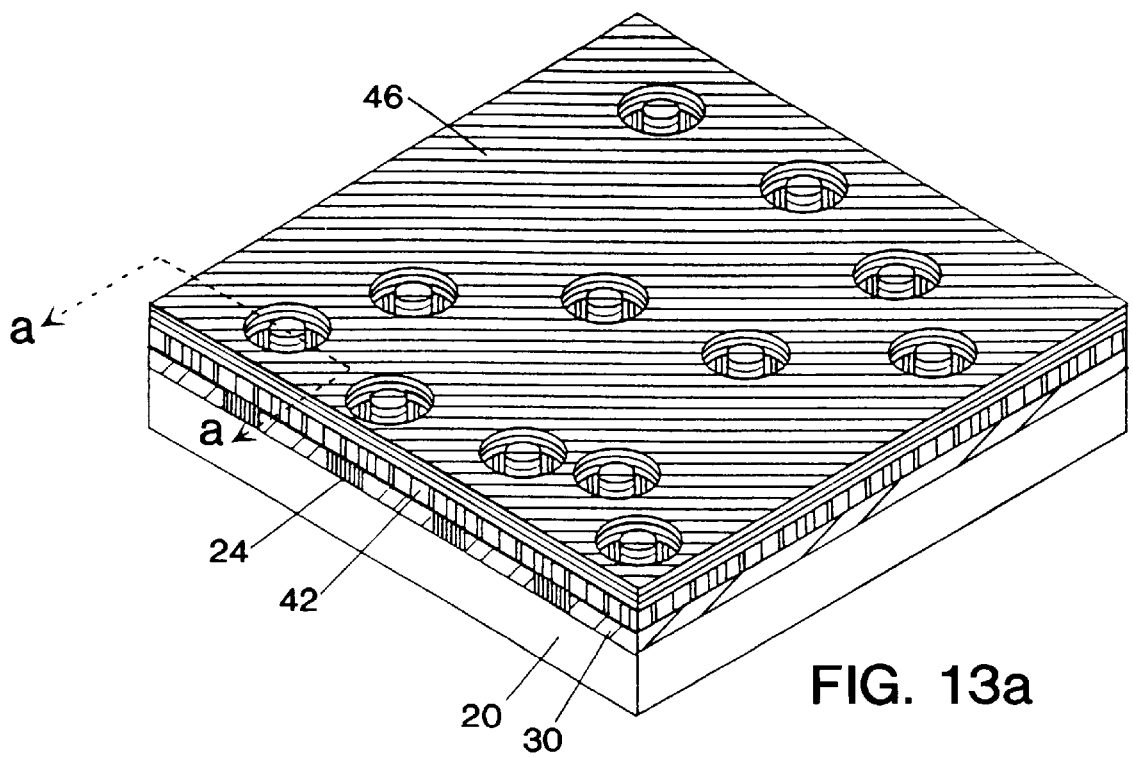
Figure 13B:
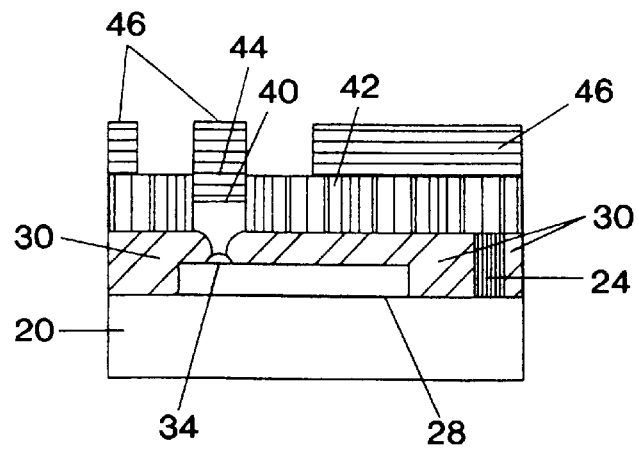

As shown in FIG. 13, a portion of the final conductive layer 46 surrounding the final vias 44 is removed such that a portion of the final conductive layer 46 provides a ground plane for the integrated microwave assembly; and, the portion of the third conductive layer 46 which fills the vias 44 provide the input/output ports for connecting the IMA to external components.

The present invention provides a method for producing an integrated microwave assembly (IMA) which creates good electrical isolation between components and requires reduced space on an IMA when compared to the prior art. The method also provides intrinsically accurate positioning of the electrical components on an IMA such that the actual position of the electrical components is very close to the desired location such that manual adjustment is typical not required to obtain good performance. In addition, because the method uses photolithographic techniques, many IMA's can be produced on a single substrate which allows the present invention to be used for batch processing lower the cost of each IMA.

Obviously, many modifications and variations to the present invention are possible in light of the above teachings. Thus, it is to be understood that, within the scope of the appended claims, the invention may be practiced otherwise than as specifically described above.

We claim as our invention:

1. A method for producing integrated microwave assembly comprising the steps of:

providing a substrate;

depositing a layer of photoresist on one side of said substrate;

selectively removing a first preselected portion of said photoresist exposing a first portion of said substrate;

applying a first conductive layer over said first portion of said substrate;

removing a second preselected portion of said photoresist to create cavities;

placing electrical components in said cavities, each of said electrical component having a top surface distal from said conductive substrate, each said top surface having an electrical contact;

covering said electrical components with a first dielectric layer;

creating first vias in said first dielectric material exposing said electrical contacts;

applying a second conductive layer into said vias and over said first dielectric material; and, removing a preselected portion of said second conductive layer creating a first signal line pattern in said second conductive layer.

2. The method as recited in claim 1, wherein the step of providing a substrate further comprises the steps of providing a conductive substrate.

3. The method as recited in claim 1, wherein the step of providing a substrate further comprises the step of providing a non-conductive substrate having a conductive material on one side.

4. The method as recited in claim 1, further comprising the steps of:

covering said first dielectric material and said first signal line pattern with a second dielectric layer;

creating second vias in said second dielectric material exposing selected portions of said second conductive layer; and, applying a third conductive layer over said selected portions of said second dielectric layer.

5. The method of claim 4, further comprising the step of:

removing a portion of said third conductive layer surrounding said second vias to provide a ground plane and input/output ports on said IMA.

6. The method of claim 5, further comprising the steps of:

removing a selected portion of said third conductive layer creating a second signal line pattern;

repeating the steps of applying a dielectric layer, creating vias in said dielectric layer, applying a conductive layer into said vias and over said dielectric layer, and, removing a portion of said conductive layer creating a signal line pattern continuing until a desired interconnect pattern is created.

7. The method of claim 6, further comprising the step of:

applying a final dielectric layer over said desired interconnect pattern;

creating final vias in said final dielectric material; and, applying a final conductive layer into said final vias and over said final dielectric layer; and, removing a portion of said final conductive layer surrounding said final vias to provide a ground plane and input/output ports on said IMA.

8. The method as recited in claim 7, wherein the step of applying a final dielectric layer over said desired interconnect pattern further comprises the step of applying a final dielectric layer to a thickness of approximately 3 mils over said desired interconnect pattern.

9. The method as recited in claim 1, wherein the step of depositing a layer of photoresist further comprises the step of depositing a 5 to 6 mil layer of photoresist; and, the step of applying a first conductive layer over said first portion of said substrate further comprises the step of applying a first conductive layer to a thickness of approximately 5–6 mils over said first portion.

10. The method as recited in claim 1, wherein the step of placing electrical components in said cavities further comprises the step of gluing electrical components on said second preselected portion of said first conductive layer using an electrically conductive epoxy glue.

11. The method as recited in claim 1, wherein the step of covering said electrical components with a first dielectric layer further comprises the step of covering said electrical components with a first polyimide material.

* * * * *